United States Patent
Ishikawa et al.

(10) Patent No.: US 8,712,345 B2
(45) Date of Patent: Apr. 29, 2014

(54) DISTORTION COMPENSATION DEVICE, DISTORTION COMPENSATION METHOD, AND RADIO TRANSMITTER

(75) Inventors: Hiroyoshi Ishikawa, Yokohama (JP); Kazuo Nagatani, Yokohama (JP); Nobukazu Fudaba, Yokohama (JP); Yuichi Utsunomiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/558,620

(22) Filed: Jul. 26, 2012

(65) Prior Publication Data
US 2013/0040587 A1    Feb. 14, 2013

(30) Foreign Application Priority Data
Aug. 11, 2011    (JP) ................................. 2011-176293

(51) Int. Cl.
*H04B 1/04*        (2006.01)
*H04B 17/00*      (2006.01)

(52) U.S. Cl.
USPC .................... 455/114.3; 455/63.1; 455/67.13; 475/296

(58) Field of Classification Search
USPC ............ 455/63.1, 67.11, 67.13, 114.2, 114.3, 455/115.1, 115.3, 127.1, 127.2; 375/295, 375/296
See application file for complete search history.

(56) References Cited

U.S. PATENT DOCUMENTS

| | | | | |
|---|---|---|---|---|
| 7,280,611 | B2* | 10/2007 | Orihashi et al. | 375/296 |
| 7,443,923 | B2* | 10/2008 | Shako et al. | 375/296 |
| 8,014,443 | B2* | 9/2011 | Nakamura et al. | 375/232 |
| 8,040,182 | B2* | 10/2011 | Horiguchi et al. | 375/297 |
| 2010/0194474 | A1 | 8/2010 | Ishikawa et al. | |

FOREIGN PATENT DOCUMENTS

| | | |
|---|---|---|
| JP | 2002-141754 | 5/2002 |
| JP | 2007-189535 | 7/2007 |
| JP | 2010-183310 | 8/2010 |

* cited by examiner

*Primary Examiner* — Quochien B Vuong
(74) *Attorney, Agent, or Firm* — Katten Muchin Rosenman LLP

(57) ABSTRACT

A distortion compensation device includes: a frequency-characteristic adding unit configured to add a frequency characteristic to an error signal to generate an added error signal, the error signal being a difference between an input signal input to an amplifier and an output signal output from the amplifier; a distortion-compensation-coefficient updating unit configured to update a distortion compensation coefficient for compensating for a distortion characteristic of the amplifier based on the added error signal; and a distortion compensation unit configured to perform distortion compensation on the input signal using the updated distortion compensation coefficient.

12 Claims, 19 Drawing Sheets

FREQUENCY

FREQUENCY

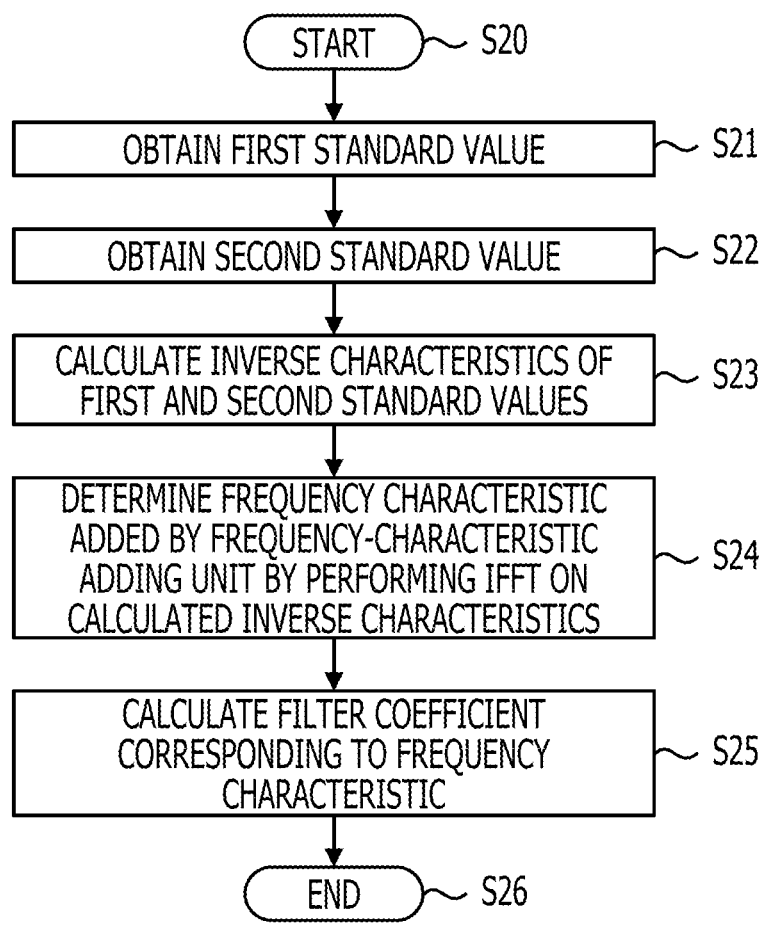

DISTORTION COMPENSATION DEVICE, DISTORTION COMPENSATION METHOD, AND RADIO TRANSMITTER

CROSS-REFERENCE TO RELATED APPLICATION(S)

This application is based upon and claims the benefit of priority of the prior Japanese Patent Application No. 2011-176293, filed on Aug. 11, 2011, the entire contents of which are incorporated herein by reference.

FIELD

The embodiments discussed herein are related to a distortion compensation device, a distortion compensation method, and a radio transmitter.

BACKGROUND

Amplifiers used in radio equipment have high power efficiency. Since linearity and power efficiency of an amplifier may be contradictory, various distortion compensation methods may be proposed. The distortion compensation methods may include a predistortion technique that adds, in advance, a characteristic which is the inverse of a distortion characteristic of the amplifier to an input signal of the amplifier, so as to reduce distortion created in the amplifier.

The distortion compensation methods may include a predistortion technique in which distortion compensation coefficients are stored in a lookup table (LUT) which is used to compensate for a hysteresis, such as a memory effect, of the amplifier. The distortion compensation methods may also include a technique which involves generating a predistortion signal using a Volterra series or a memory polynomial expansion.

Related art is disclosed, for example, in Japanese Laid-open Patent Publications Nos. 2007-189535, 2002-141754, and 2010-183310.

SUMMARY

According to one aspect of the embodiments, a distortion compensation device includes: a frequency-characteristic adding unit configured to add a frequency characteristic to an error signal to generate an added error signal, the error signal being a difference between an input signal input to an amplifier and an output signal output from the amplifier; a distortion-compensation-coefficient updating unit configured to update a distortion compensation coefficient for compensating for a distortion characteristic of the amplifier based on the added error signal; and a distortion compensation unit configured to perform distortion compensation on the input signal using the updated distortion compensation coefficient.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 illustrates an exemplary process of calculating a frequency characteristic;

DESCRIPTION OF EMBODIMENTS

Figure 1:
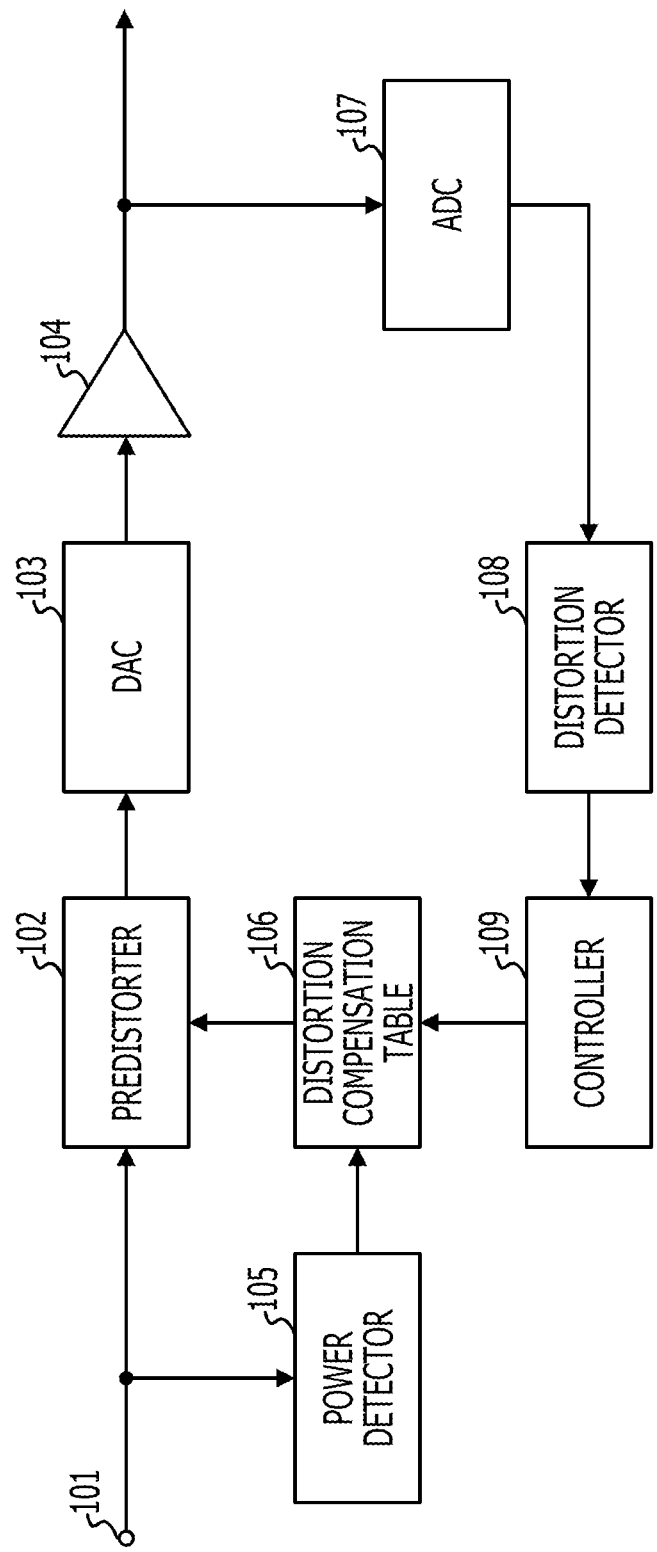
FIG. 1 illustrates an exemplary distortion compensation device.

FIG. 1 illustrates an exemplary distortion compensation device. The distortion compensation device illustrated in FIG. 1 uses a predistortion technique which uses an LUT. In the distortion compensation device, transmission data (input signal), including I and Q signals, input from an input terminal 101 is supplied to a predistorter 102 and a power detector 105. Based on an amplitude/phase distortion compensation signal from a distortion compensation table 106, the predistorter 102 performs, on the input signal, process for compensating for a distortion characteristic of an amplifier 104. For example, the predistorter 102 controls the amplitude or phase of the input signal such that distortion created in the amplifier 104 is cancelled out. For example, the predistorter 102 performs process which adds a characteristic inverse of the distortion characteristic of the amplifier 104 to the input signal in advance, for example, a distortion compensation process.

The distortion compensation table 106 may be a memory that stores amplitude/phase compensation data corresponding to the power of the input signal. For example, the distortion compensation table 106 may store the compensation data associated with the amplitude of the input signal. The power detector 105 detects the power of the input signal. The power detector 105 notifies the distortion compensation table 106 of the result of the detection. The amplitude/phase compensation data corresponding to the power of the input signal is read from the distortion compensation table 106 and supplied as an amplitude/phase distortion compensation signal to the predistorter 102.

The input signal distortion-compensated by the predistorter 102 is converted to an analog signal by a digital-to-analog converter (DAC) 103, amplified by the amplifier 104, and output therefrom. For example, if a radio transmitter includes the distortion compensation device, the input signal is converted to a radio transmission frequency signal, amplified by the amplifier 104, and transmitted from an antenna. Although the amplified analog signal may be distorted depending on the distortion characteristic of the amplifier 104, the distortion generated in the amplifier 104 may be compensated (or cancelled out), because the predistorter 102 performs distortion compensation on the input signal in advance.

For generating amplitude/phase compensation data stored in the distortion compensation table 106, a feedback circuit may be provided which includes an analog-to-digital converter (ADC) 107, a distortion detector 108, and a controller 109. An analog signal output from the amplifier 104 is converted as a feedback signal to an intermediate frequency signal, which is then converted to a digital signal by the ADC 107 and supplied to the distortion detector 108. The distortion detector 108 detects distortion components contained in the feedback signal. Based on the detected distortion components, the controller 109 adjusts or updates the amplitude/phase compensation data stored in the distortion compensation table 106.

The distortion characteristic of the amplifier 104 may be compensated by adjusting the amplitude/phase compensation data in accordance with changes in environment, such as ambient temperature, or the elapse of time.

The output of an amplifier may be saturated as the input increases. As a result, the amplifier may become unable to output a linear signal in response to the input signal. Due to such a nonlinear characteristic, unwanted signal components may be generated outside the frequency band of the input signal. Of bands outside the frequency band of the input signal, a band of frequencies lower than frequencies of the input signal may be referred to as a first frequency band, and a band of frequencies higher than frequencies of the input signal may be referred to as a second frequency band.

The unwanted signal components may cause interference, for example, with neighboring external systems. Therefore, the output signal of the amplifier may be defined by a standard (spurious standard), such as an adjacent channel power ratio (ACPR) or spectrum emission mask (SEM).

Figure 2:
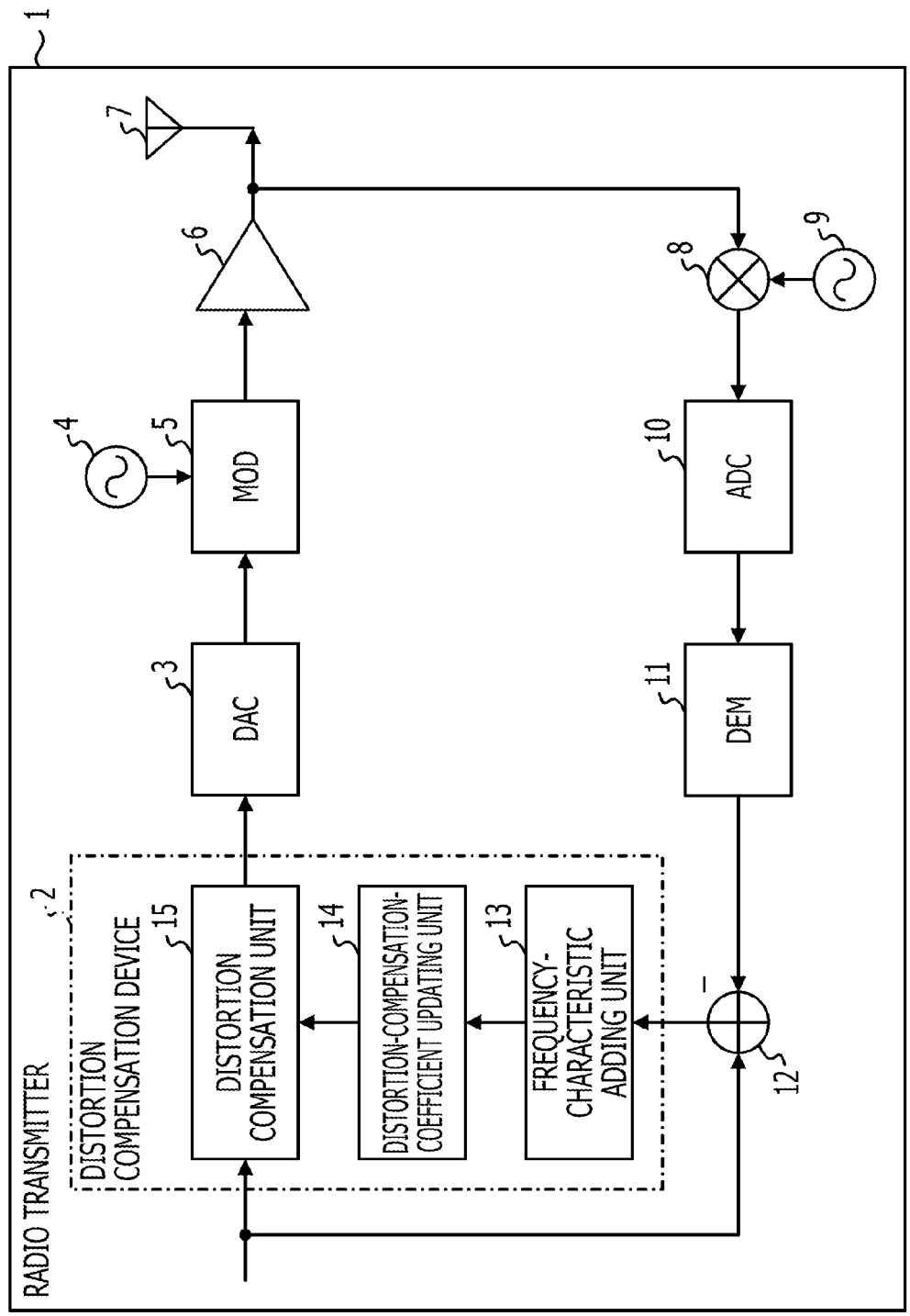
FIG. 2 illustrates an exemplary radio transmitter.

FIG. 2 illustrates an exemplary radio transmitter.

A radio transmitter 1 includes a distortion compensation device 2, a digital-to-analog converter (DAC) 3, a local oscillator 4, a quadrature modulator (MOD) 5, an amplifier 6, and an antenna 7. The radio transmitter 1 further includes a multiplier 8, a local oscillator 9, an ADC 10, a quadrature demodulator (DEM) 11, and an adder 12.

In the radio transmitter 1, transmission data (input signal), including I and Q signals, is supplied to the distortion compensation device 2 and the adder 12. The distortion compensation device 2 performs distortion compensation on the input signal based on a difference between the input signal and a feedback signal of the output signal of the amplifier 6, for example, based on an error signal, the difference being supplied from the adder 12.

The input signal distortion-compensated by the distortion compensation device 2 is converted by the DAC 3 from a digital signal to an analog signal, which is then quadrature-modulated by the MOD 5 using an oscillation frequency of the local oscillator 4. The quadrature-modulated signal output from the MOD 5 is amplified by the amplifier 6 and transmitted from the antenna 7 to a radio receiver or the like. The output signal from the amplifier 6 is frequency-converted by the multiplier 8 to an intermediate frequency (IF) signal using an oscillation frequency of the local oscillator 9, converted by the ADC 10 from an analog signal to a digital signal, and supplied to the DEM 11. The DEM 11 quadrature-demodulates the digital signal from the ADC 10, and supplies the quadrature-demodulated signal as a feedback signal to the adder 12.

Figure 3:
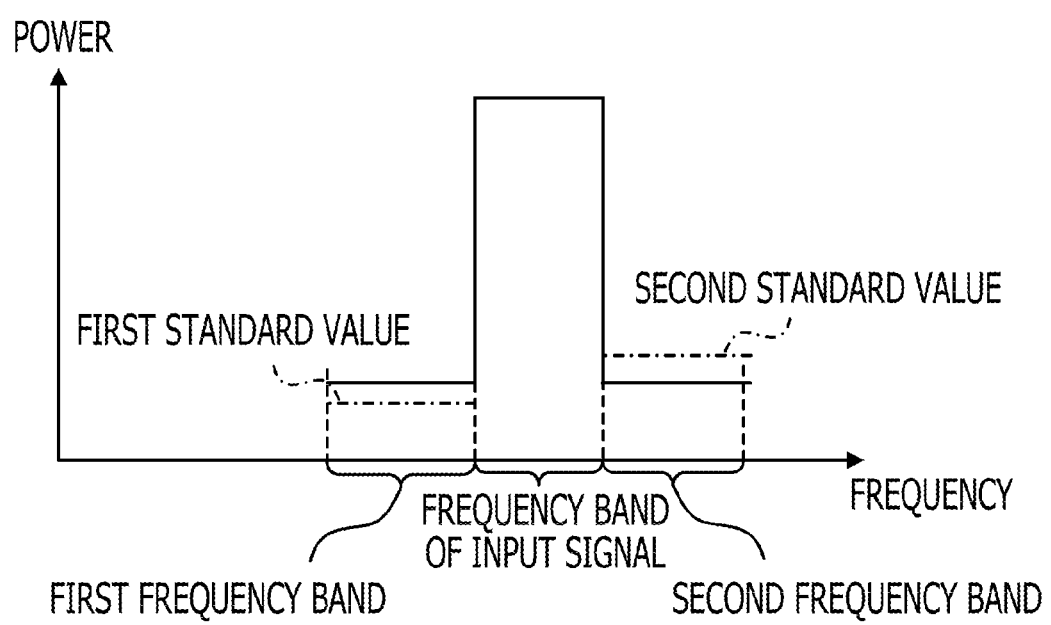
FIG. 3 illustrates an exemplary relationship between the output of amplifier and the frequency.

The adder 12 adds the input signal to an inverted feedback signal to generate an error signal, and supplies the error signal to the distortion compensation device 2. For example, before being supplied to the adder 12, the input signal may be delayed by a delay unit (not illustrated) for time adjustment between transmission data I and Q and demodulated data I and Q. FIG. 3 illustrates an exemplary relationship between an output of amplifier and a frequency. In FIG. 3, the vertical axis represents the output of amplifier and the horizontal axis represents the frequency. In the distortion compensation device illustrated in FIG. 1, unwanted signal components contained in the output signal of the amplifier 104 do not have any distinction between first and second frequency bands and thus may be uniformly compensated, for example, as illustrated in FIG. 3.

For example, a predistorter using a Volterra series may generate a predistortion signal by using the following equation:

$$y(t) = \sum_{i=0}^{Delay} \sum_{j=0}^{Delay} \sum_{k=0}^{Order} h_{i,j,k} \, |x(t-j)|^k \, x(t-i) \quad (1)$$

where x(t) represents a transmission signal input to the predistorter, y(t) represents an output signal of the predistorter, h represents a coefficient of the Volterra series, Delay represents a maximum delay in the Volterra series, and Order represents a maximum order in the Volterra series. Even when distortion generated in the amplifier 104 has a frequency characteristic, the distortion may be uniformly compensated on the frequency axis, so that residual distortion contained in the output signal may be symmetric with respect to the input signal on the frequency axis.

For example, if there are a plurality of neighboring external systems using the first or second frequency band, for example as illustrated in FIG. 3, a spurious standard (first standard value) set for the first frequency band may be different from a spurious standard (second standard value) set for the second frequency band. As illustrated in FIG. 3, the output signal from the distortion compensation device illustrated in FIG. 1 may satisfy the second standard value in the second frequency band, but may not satisfy the first standard value in the first frequency band. At least one of different standard values may not be satisfied.

The distortion compensation device 2 adds a predetermined frequency characteristic to an error signal supplied from the adder 12, and performs distortion compensation on the input signal by using a distortion compensation coefficient computed based on the error signal to which the predetermined frequency characteristic has been added. The distortion compensation device 2 illustrated in FIG. 2 may include a frequency-characteristic adding unit 13, a distortion-compensation-coefficient updating unit 14, and a distortion compensation unit 15.

The frequency-characteristic adding unit 13 adds a predetermined frequency characteristic to an error signal supplied from the adder 12. The predetermined frequency characteristic added to the error signal may be set, for example, by an experiment or simulation such that each standard value for the output signal of the amplifier 6 is satisfied. The function of the frequency-characteristic adding unit 13 may be executed, for example, by an analog or digital filter. The function of the frequency-characteristic adding unit 13 may be executed by a processor, such as a central processing unit (CPU) or a digital signal processor (DSP). For example, the frequency-characteristic adding unit 13 may include an equalizer, such as a finite impulse response (FIR) filter or an infinite impulse response (IIR) filter. If the input signal is a complex signal, the frequency-characteristic adding unit 13 may include a complex coefficient FIR filter or a complex coefficient IIR filter.

Based on the error signal to which the predetermined frequency characteristic has been added by the frequency-characteristic adding unit 13, the distortion-compensation-coefficient updating unit 14 updates a distortion compensation coefficient to be supplied to the distortion compensation unit 15. For example, based on the error signal to which the predetermined frequency characteristic has been added by the frequency-characteristic adding unit 13, the distortion-compensation-coefficient updating unit 14 calculates an update for the distortion compensation coefficient. As a new distortion compensation coefficient, a value obtained by adding the update to the current distortion compensation coefficient is supplied from the distortion-compensation-coefficient updating unit 14 to the distortion compensation unit 15. Thus, the distortion compensation coefficient is updated. The distortion-compensation-coefficient updating unit 14 may include a distortion compensation table that stores distortion compensation coefficients for compensating for a distortion characteristic of the amplifier 6. The distortion compensation table may store, for example, amplitude/phase compensation data (distortion compensation coefficient) corresponding to power of the input signal associated with the amplitude of the input signal. For example, the distortion compensation table may be provided either internal or external to the distortion compensation device 2. The distortion compensation table may be a memory, such as a read-only memory (ROM) or a random-access memory (RAM). The distortion-compensation-coefficient updating unit 14 may generate a predistortion signal using a Volterra series or a memory polynomial expansion.

The distortion compensation unit 15 performs distortion compensation on the input signal using the distortion compensation coefficient updated by the distortion-compensation-coefficient updating unit 14. For example, the distortion compensation unit 15 controls the amplitude or phase of the input signal such that distortion components contained in the error signal to which the predetermined frequency characteristic has been added by the frequency-characteristic adding unit 13 are uniformly distributed on the frequency axis. The functions of the distortion-compensation-coefficient updating unit 14 and the distortion compensation unit 15 may be executed by a processor, such as a CPU or DSP.

The predetermined frequency characteristic added to the error signal by the frequency-characteristic adding unit 13 may be set such that, in the output signal of the amplifier 6, a first distortion level in the first frequency band lower than the frequency band of the input signal satisfies the first standard value set for the first frequency band and a second distortion level in the second frequency band higher than the frequency band of the input signal satisfies the second standard value set for the second frequency band. Here, the second standard value is different from the first standard value.

Each standard value for the output signal of the amplifier 6 may be either stored by the frequency-characteristic adding unit 13 in advance or set externally by an administrator or user of the radio transmitter 1. Based on interference waves from other systems located around the radio transmitter 1, the frequency-characteristic adding unit 13 may calculate each standard value that does not cause interference with frequency signals used by the other systems.

Figure 4A:
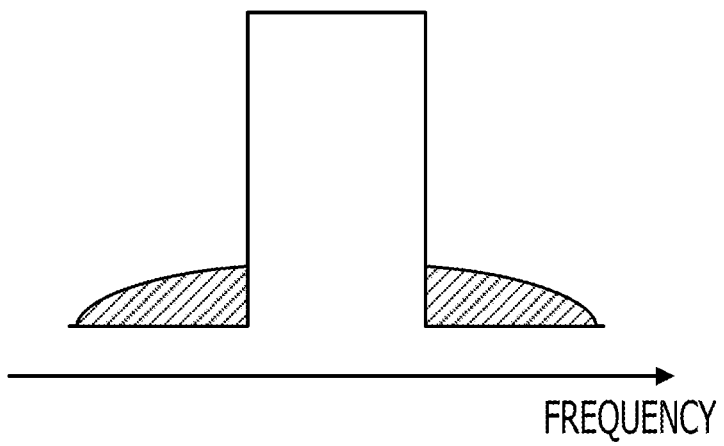
FIG. 4A to FIG. 4C illustrate an exemplary signal.
Figure 4B:
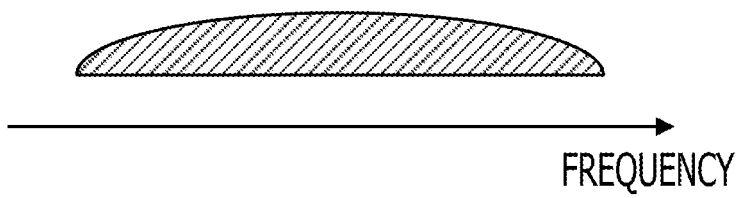
Figure 4C:
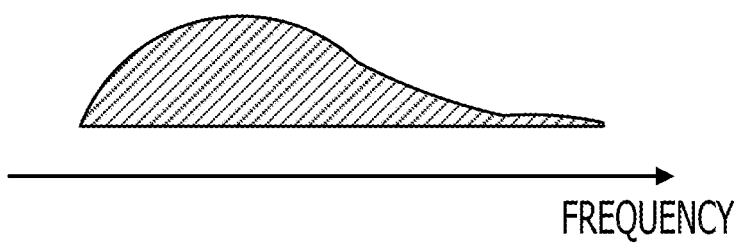

FIG. 4A to FIG. 4C illustrate an exemplary signal. For example, as illustrated in FIG. 3, when the first standard value and the second standard value are set for the output signal of the amplifier 6, a frequency characteristic may be added to the error signal by the frequency-characteristic adding unit 13. FIG. 4A illustrates an output signal of the amplifier 6 immediately after the addition of the frequency characteristic. As illustrated in FIG. 3, the second distortion level in the second frequency band is lower than the second standard value and thus satisfies the standard, whereas the first distortion level in the first frequency band is not lower than the first standard value and thus does not satisfy the standard.

FIG. 4B illustrates an error signal immediately after the addition of the frequency characteristic. The error signal may represent the level of distortion created in the amplifier 6. FIG. 4C illustrates an output signal of the frequency-characteristic adding unit 13 immediately after the addition of the frequency characteristic. As illustrated in FIG. 4C, a predetermined frequency characteristic is added such that the first distortion level in the first frequency band is higher than the second distortion level in the second frequency band. For example, by the frequency characteristic added to the error signal by the frequency-characteristic adding unit 13, the level of residual distortion, for example, the first frequency band illustrated in FIG. 4C may be appeared high to the distortion-compensation-coefficient updating unit 14 in the frequency band where a higher level of distortion compensation performance is desired.

Upon receipt of the signal illustrated in FIG. 4C, the distortion-compensation-coefficient updating unit 14 updates the distortion compensation coefficient based on a determination that the amount of distortion compensation for the first distortion level is larger than that for the second distortion level. The distortion compensation unit 15 performs distortion compensation on the input signal using the updated distortion compensation coefficient. The distortion-compensation-coefficient updating unit 14 updates the distortion compensation coefficient based on computation such that residual distortion contained in the output of the frequency-characteristic adding unit 13 is distributed uniformly on the frequency axis. As a result, the output signal of the amplifier 6 may include residual distortion which is imbalanced in the distribution of frequencies.

Figure 5A:
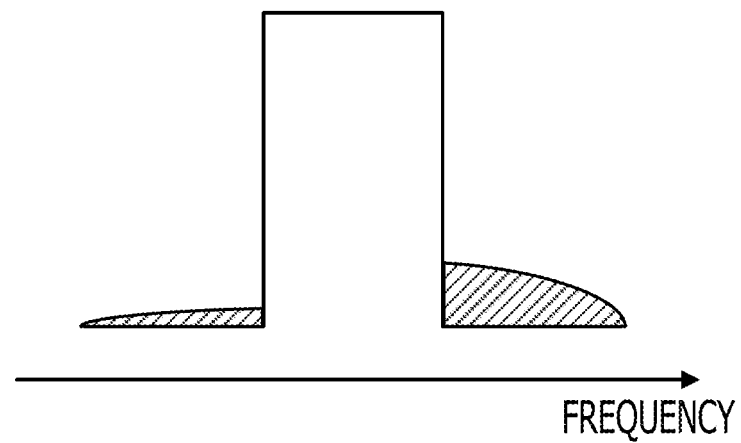
FIG. 5A to FIG. 5C illustrate an exemplary signal.
Figure 5B:
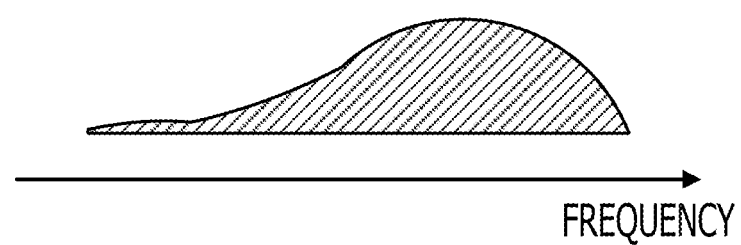
Figure 5C:
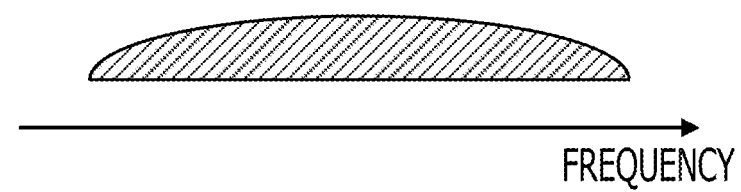

FIG. 5A to FIG. 5C illustrate an exemplary signal. Each of the signals illustrated in FIG. 5A to FIG. 5C may be a signal obtained at the time of completion of updating the distortion compensation coefficient. FIG. 5A may illustrate an output signal of the amplifier 6 obtained at the time of completion of updating the distortion compensation coefficient. In FIG. 5A, the first distortion level in the first frequency band is lower than that in FIG. 4A and the second distortion level in the second frequency band is higher than that in FIG. 4A.

Figure 6:
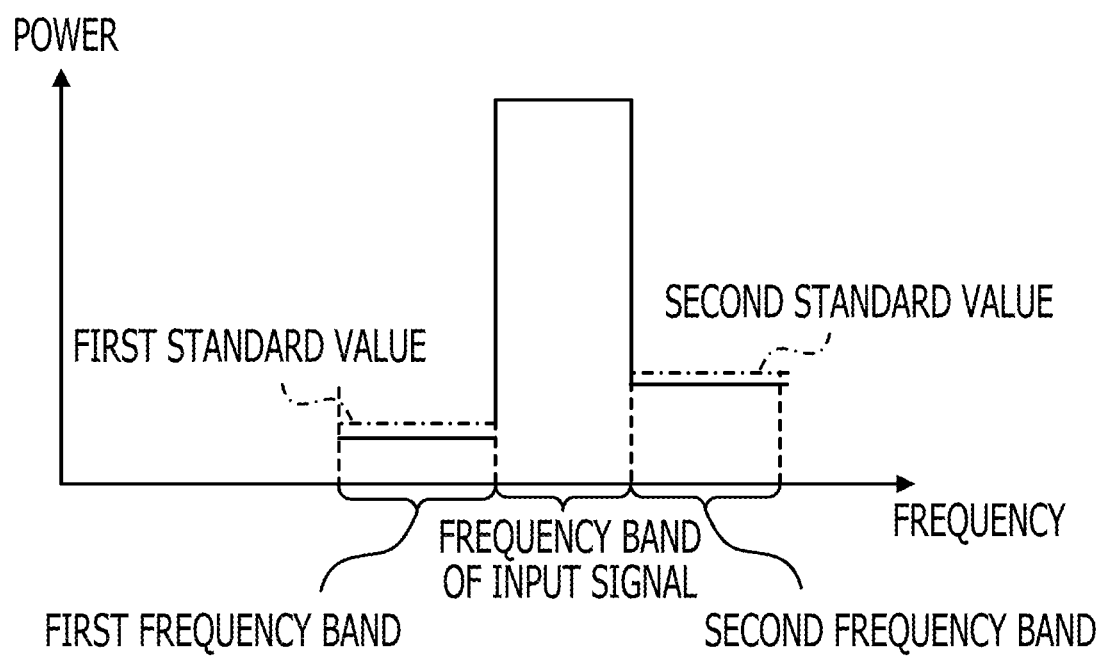
FIG. 6 illustrates an exemplary relationship between an output of amplifier and a frequency.

FIG. 5B illustrates an error signal obtained at the time of completion of updating the distortion compensation coefficient. FIG. 5C illustrates an output signal of the frequency-characteristic adding unit 13 obtained at the time of completion of updating the distortion compensation coefficient. FIG. 6 illustrates an exemplary relationship between an output of amplifier and a frequency. FIG. 6 may illustrate a relationship between the output signal illustrated in FIG. 5A and each of the standard values illustrated in FIG. 3. When a predetermined frequency characteristic is added to the error signal, a reduction in distortion compensation performance may become permissible in the second frequency band where the standard is less strict, while there may be an improvement in distortion compensation performance in the first frequency band where the standard is relatively strict.

As illustrated in FIG. 6, the first distortion level and the second distortion level in the output signal of the amplifier 6 are asymmetrically set with respect to the input signal on the frequency axis, so that the corresponding standards for the output signal of the amplifier 6 may be satisfied. When the output signal of the amplifier 6 satisfies the standards, it may be possible to reduce interference with other radio systems and radio equipment.

Since a frequency characteristic is added to an error signal containing distortion components generated in the amplifier 6, no additional frequency characteristics may be given to the transmission signal. Therefore, as compared to the case where a frequency characteristic is added to the transmission signal, degradation in signal quality may be reduced. The first standard value is smaller than the second standard value in FIG. 3 and FIG. 6. However, even if the second standard value is smaller than the first standard value, the output signal of the amplifier 6 may satisfy the standard values in substantially the same or similar method.

Figure 7:
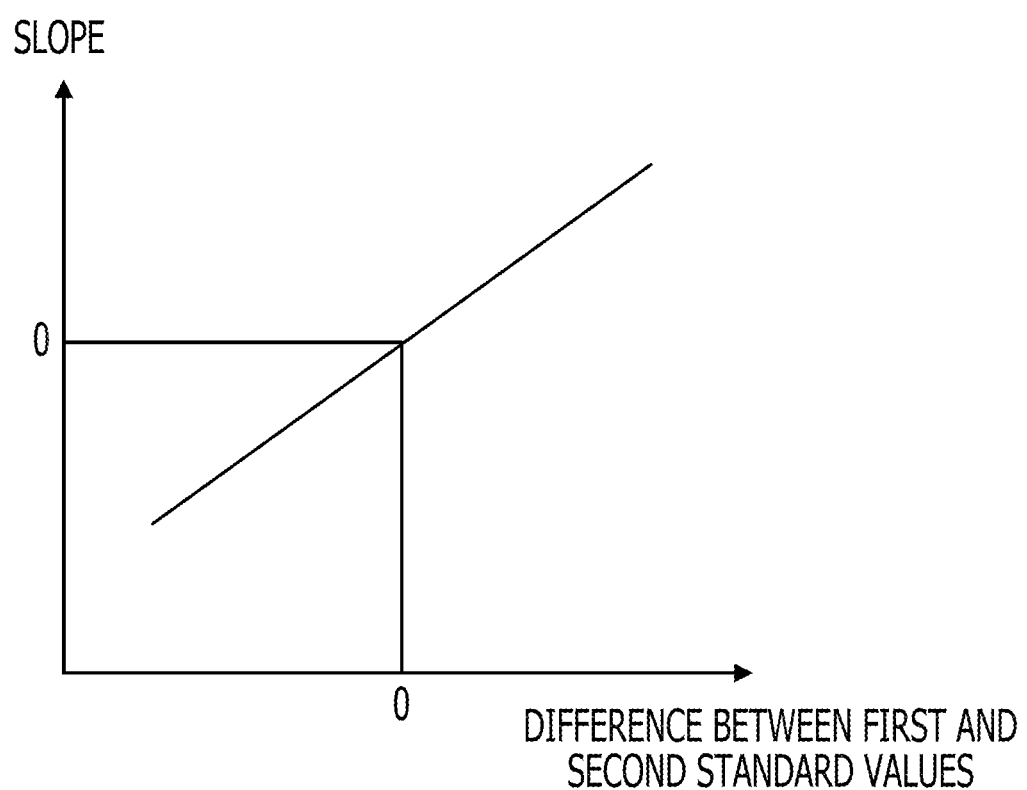
FIG. 7 illustrates an exemplary relationship between a slope and a difference between standard values.

The frequency characteristic added to the error signal by the frequency-characteristic adding unit 13 may be calculated, for example, as a linear function having a slope determined based on a difference between the first standard value and the second standard value set for the first frequency band and the second frequency band, respectively. FIG. 7 illustrates a relationship between a slope and a difference between standard values. The slope may be that of the frequency characteristic represented by a linear function. The relationship between the slope and the difference between standard values illustrated in FIG. 7 may be determined, for example, based on results of an experiment or simulation.

When the first standard value and the second standard value are substantially equal, the value of the slope may be zero. Since the frequency characteristic added to the error signal by the frequency-characteristic adding unit 13 stays substantially the same on the frequency axis, there may be no difference between the first distortion level and the second distortion level. Instead of adding a frequency characteristic to the error signal, the frequency-characteristic adding unit 13 may add to the error signal a constant which is uniform on the frequency axis.

Figure 8:
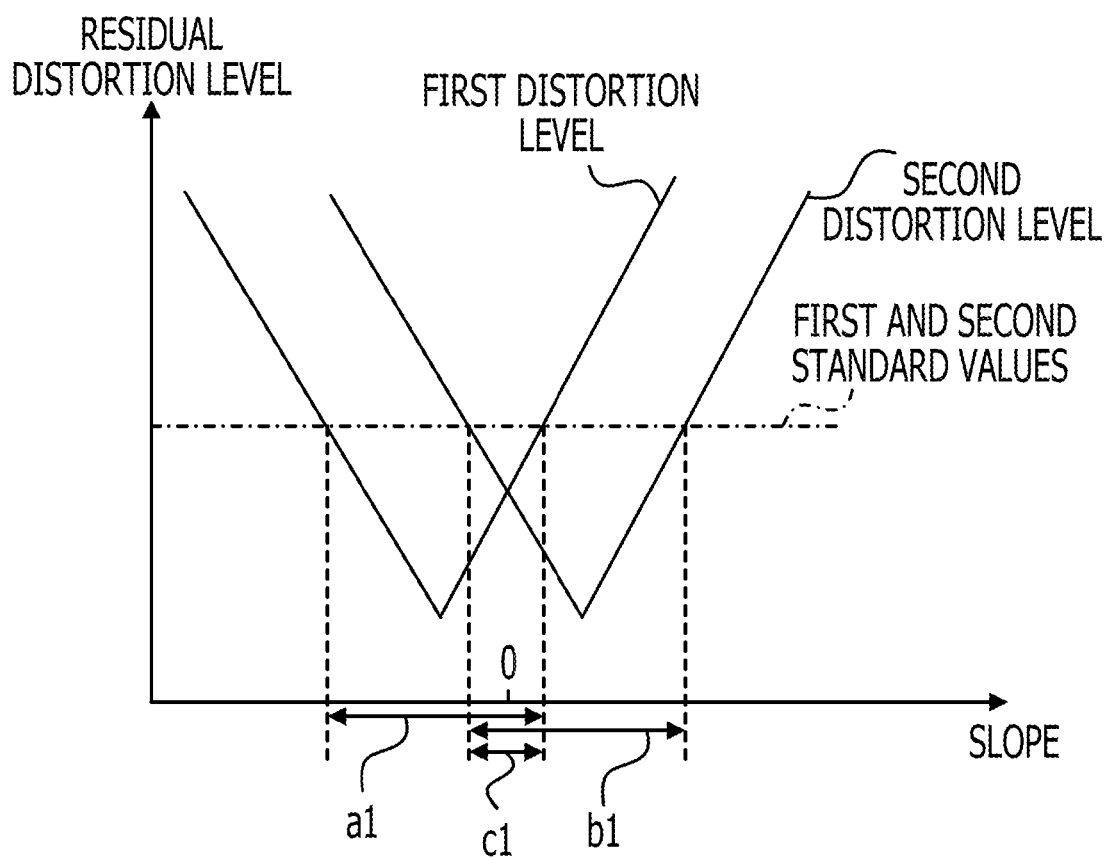
FIG. 8 illustrates an exemplary relationship between a residual distortion level and a slope.

FIG. 8 illustrates an exemplary relationship between a residual distortion level and a slope. FIG. 8 may illustrate a relationship between the residual distortion level of an output signal and the slope in the case where the first standard value and the second standard value are substantially equal. V-shaped characteristics illustrated in FIG. 8 represent increases and decreases in the first distortion level and the second distortion level, with respect to the slope of a frequency characteristic which is represented by a linear function and is added to an error signal. Each of the V-shaped characteristics may be calculated by an experiment or simulation, or may be determined based on actual measurement of the level of residual distortion contained in the output signal of the amplifier 6.

If the slope is within the range indicated by "$a_1$" in FIG. 8, the first distortion level may satisfy the first standard value. If the slope is within the range indicated by "$b_1$" in FIG. 8, the second distortion level may satisfy the second standard value. If the slope is set to fall within the range indicated by "$c_1$" where the range "$a_1$" and the range "$b_1$" in FIG. 8 overlap, the first distortion level and the second distortion level may satisfy the first standard value (or second standard value).

When the first standard value and the second standard value are substantially equal, if the slope of a frequency characteristic, which is represented by a linear function and is added to an error signal, is set to zero or set to fall within the range indicated by "$c_1$" in FIG. 8, the output signal of the amplifier 6 may satisfy each of the standard values. As illustrated in FIG. 7, when the first standard value is larger than the second standard value, the slope is a positive number. In this case, a frequency characteristic added to an error signal by the frequency-characteristic adding unit 13 is represented by a linear function having a positive slope. Therefore, based on the frequency characteristic, the level of residual distortion may be able to be appeared high to the distortion-compensation-coefficient updating unit 14 in the second frequency band where a higher level of distortion compensation performance is desired. Thus, in the output signal of the amplifier 6, the second distortion level is lower than the first distortion level. If an experiment or simulation is carried out properly, the second distortion level may be within the second standard value and the first distortion level may fall within a range that satisfies the first standard value.

As illustrated in FIG. 7, when the second standard value is larger than the first standard value, the slope is a negative number. In this case, a frequency characteristic added to an error signal by the frequency-characteristic adding unit 13 is represented by a linear function having a negative slope. Therefore, based on the frequency characteristic, the level of residual distortion may be able to be appeared high to the distortion-compensation-coefficient updating unit 14 in the first frequency band where a higher level of distortion compensation performance is desired. Thus, in the output signal of the amplifier 6, the first distortion level is lower than the second distortion level. If an experiment or simulation is carried out properly, the first distortion level may be within the first standard value and the second distortion level may fall within a range that satisfies the second standard value.

Figure 9:
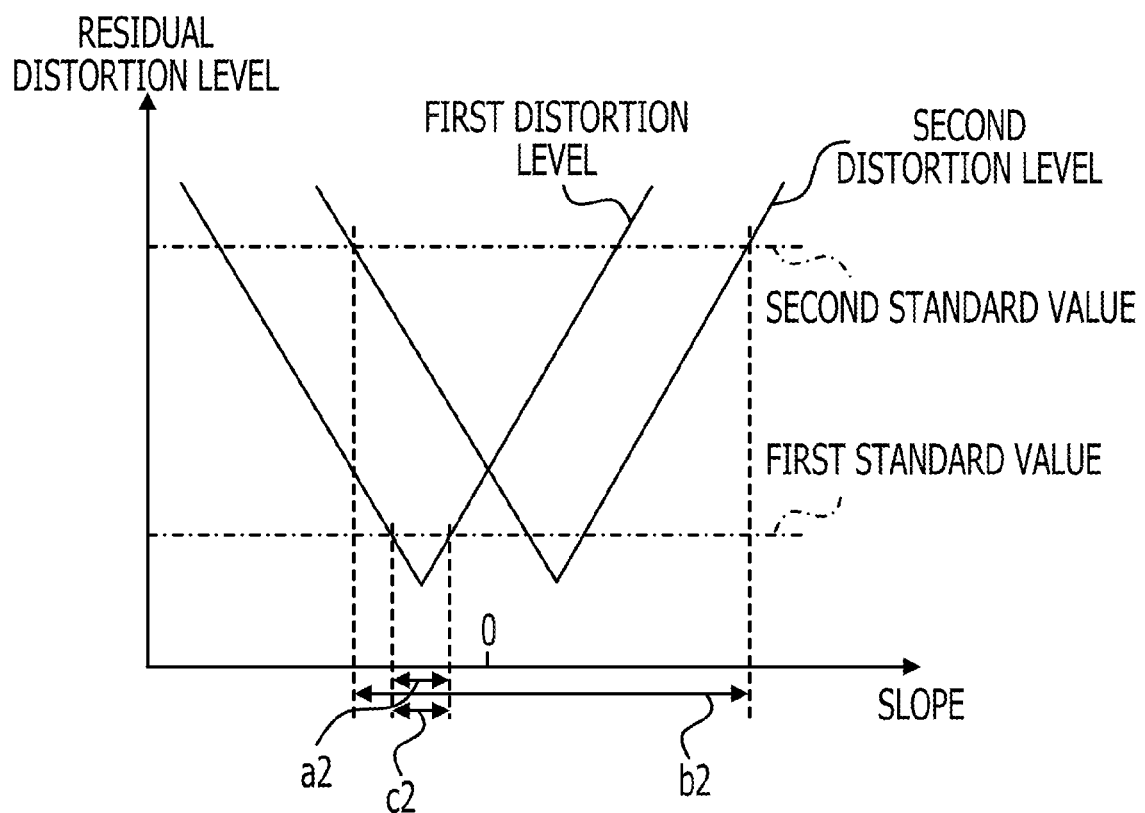
FIG. 9 illustrates an exemplary relationship between a residual distortion level and a slope.

FIG. 9 illustrates an exemplary relationship between a residual distortion level and a slope. FIG. 9 may illustrate a relationship between the residual distortion level of an output signal and the slope in the case where the second standard value is larger than the first standard value. V-shaped characteristics illustrated in FIG. 9 represent increases and decreases in the first distortion level and the second distortion level, with respect to the slope of a frequency characteristic which is represented by a linear function and is added to an error signal. Each of the V-shaped characteristics may be calculated by an experiment or simulation, or may be determined based on actual measurement of the level of residual distortion contained in the output signal of the amplifier 6.

If the slope is within the range indicated by "$a_2$" in FIG. 9, the first distortion level may satisfy the first standard value. If the slope is within the range indicated by "$b_2$" in FIG. 9, the second distortion level may satisfy the second standard value. Therefore, if the slope is set to fall within the range indicated by "$c_2$" where the range "$a_2$" and the range "$b_2$" in FIG. 9 overlap, the first distortion level and the second distortion level may satisfy the first standard value and the second standard value, respectively.

Figure 10:
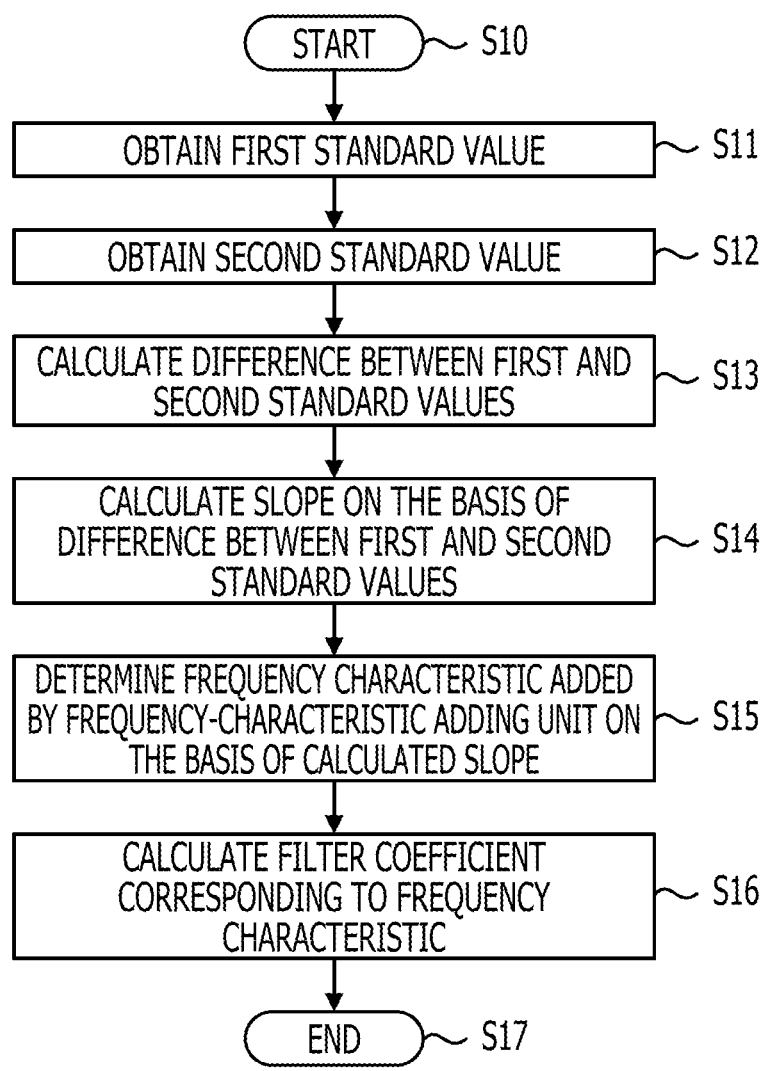
FIG. 10 illustrates an exemplary process of calculating a frequency characteristic.

When the second standard value is larger than the first standard value, the slope of a frequency characteristic, which is represented by a linear function and is added to an error signal, is set to fall within the range indicated by "$c_a$" in FIG. 9. Therefore, the output signal of the amplifier 6 may satisfy each of the standard values. FIG. 10 illustrates an exemplary process of calculating a frequency characteristic. As illustrated in FIG. 10, in operation S10, a process of calculating a frequency characteristic is started, for example, by the start of operation of the amplifier 6. In operations S11 and S12, the frequency-characteristic adding unit 13 obtains the first standard value and the second standard value for the output signal of the amplifier 6.

In operation S13, the frequency-characteristic adding unit 13 calculates a difference between the first standard value and the second standard value. In operation S14, if the first standard value and the second standard value are equal, the frequency-characteristic adding unit 13 uses, for example, the calculation method illustrated in FIG. 7 and FIG. 8 to calculate the slope of a frequency characteristic which is represented by a linear function and is added to an error signal. Then, in operation S15, the frequency-characteristic adding unit 13 determines the frequency characteristic.

In operation S14, if the first standard value and the second standard value are different, the frequency-characteristic adding unit 13 uses, for example, the calculation method illustrated in FIG. 7 and FIG. 9 to calculate the slope of a frequency characteristic which is represented by a linear function and is added to an error signal. Then, in operation S15, the frequency-characteristic adding unit 13 determines the frequency characteristic. For example, the frequency-characteristic adding unit 13 calculates a filter coefficient corresponding to the frequency characteristic determined in operation S15, and sets the calculated filter coefficient in a digital filter. In operation S16, the frequency characteristic determined in operation S15 is added to the error signal. The process ends in operation S17.

Figure 11:
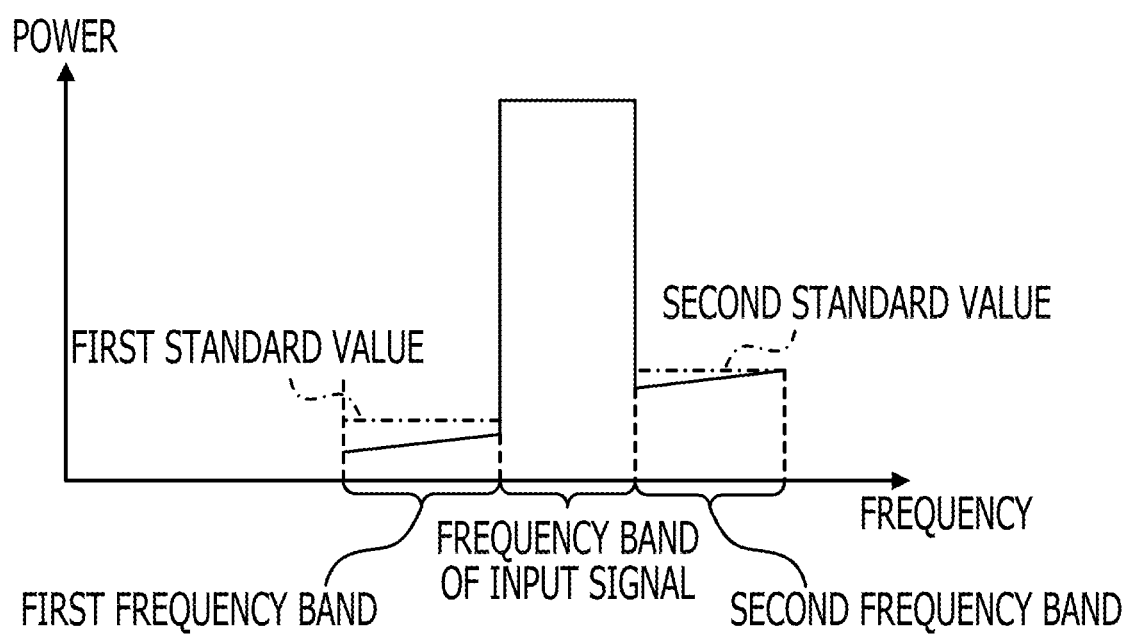
FIG. 11 illustrates an exemplary relationship between an output of amplifier and a frequency.

FIG. 11 illustrates an exemplary relationship between an output of amplifier and a frequency. FIG. 11 may illustrate a relationship between the standard values and the output signal of the amplifier 6 obtained by the above-described process when the second standard value is larger than the first standard value. A frequency characteristic to be added to an error signal is determined as a frequency characteristic represented by a linear function calculated based on the standard values. Therefore, the standard values for the output signal of the amplifier 6 may be satisfied.

The slope may be determined based on a difference between the first standard value and the second standard value. For example, the slope may be determined based on a ratio between the first standard value and the second standard value. As illustrated in FIG. 3, FIG. 6, and FIG. 11, the first standard value and the second standard value may be constant in the first frequency band and the second frequency band, respectively.

Figure 12:
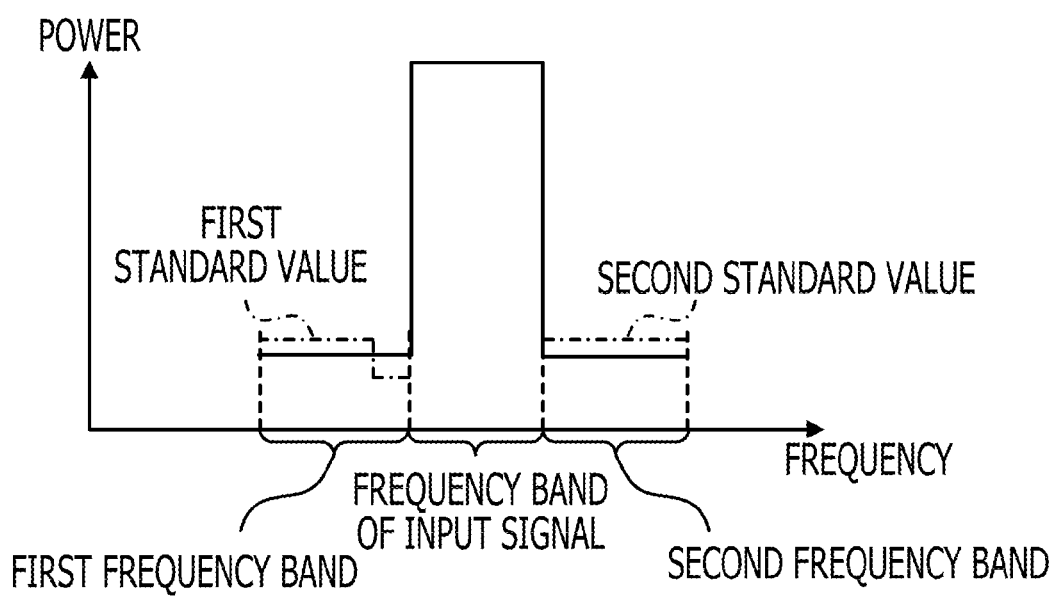
FIG. 12 illustrates an exemplary relationship between an output of amplifier and a frequency.
Figure 13A:
FIG. 13A and FIG. 13B each illustrate an exemplary relationship between an output of amplifier and a frequency.
Figure 13B:
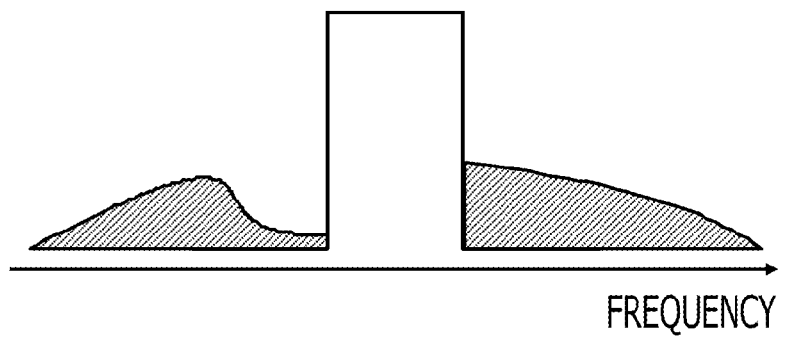

FIG. 12 illustrates an exemplary relationship between an output of amplifier and a frequency. FIG. 13A and FIG. 13B each illustrate a relationship between the output of amplifier and the frequency. For example, the first standard value may be locally reduced in the first frequency band. By adding the frequency characteristic illustrated in FIG. 13A to an error signal, the frequency-characteristic adding unit 13 may be able to appear the level of residual distortion high to the distortion-compensation-coefficient updating unit 14 in part of the first frequency band where a higher level of distortion compensation performance is desired. Therefore, for example, as illustrated in FIG. 13B, the first distortion level in the output signal of the amplifier 6 may be locally reduced in the first frequency band.

Figure 14A:
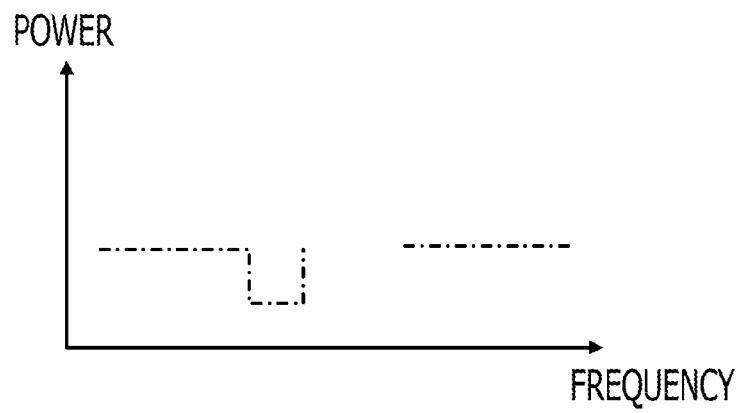
FIG. 14A to FIG. 14C each illustrate an exemplary relationship between an output of amplifier and a frequency.
Figure 14B:
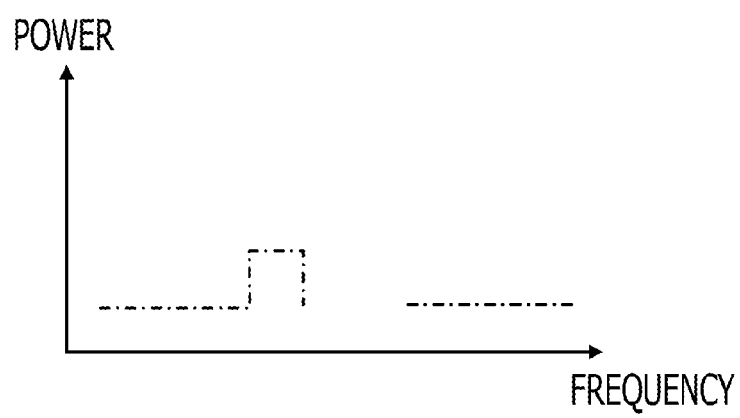
Figure 14C:
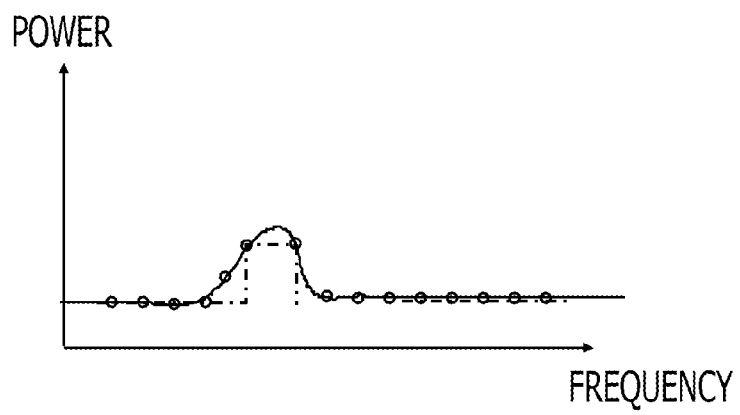

FIG. 14A to FIG. 14C each illustrate an exemplary relationship between an output of amplifier and a frequency. FIG. 14A illustrates the first standard value and the second standard value. FIG. 14B illustrates an inverse characteristic of the frequency characteristic illustrated in FIG. 14A. FIG. 14C illustrates a frequency characteristic to be added to an error signal.

FIG. 15 illustrates an exemplary process of calculating a frequency characteristic. In operation S20, a process of calculating a frequency characteristic is started, for example, in response to the start of operation of the amplifier 6. In operations S21 and S22, the frequency-characteristic adding unit 13 obtains the first standard value and the second standard value illustrated in FIG. 14A. In operation S23, the frequency-characteristic adding unit 13 calculates inverse characteristics of the respective first and second standard values illustrated in FIG. 14B.

In operation S24, the frequency-characteristic adding unit 13 performs an inverse discrete Fourier transform or inverse fast Fourier transform (IFFT) on the inverse characteristics calculated in operation S23. As illustrated in FIG. 14C, regularly-spaced fitting points (indicated by open circles) are set for the inverse characteristics illustrated in FIG. 14B. A frequency characteristic to be added to an error signal is thus determined.

Figure 16:
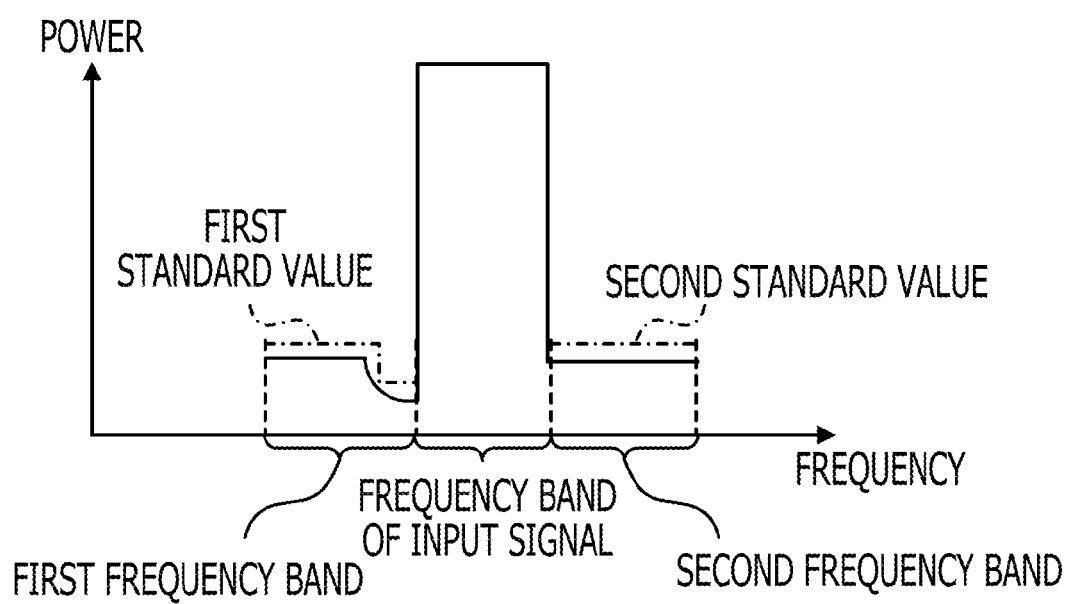
FIG. 16 illustrates an exemplary relationship between an output of amplifier and a frequency.

In operation S25, the frequency-characteristic adding unit 13 calculates a filter coefficient corresponding to the frequency characteristic determined in operation S24. For example, the frequency-characteristic adding unit 13 sets the calculated filter coefficient in a digital filter. Thus, the frequency characteristic determined in operation S24 is added to the error signal. The process ends in operation S26. FIG. 16 illustrates an exemplary relationship between an output of amplifier and a frequency. FIG. 16 may illustrate an exemplary relationship between the standard values and the output signal of the amplifier 6 obtained by the above-described process when the first standard value is locally small.

Since a frequency characteristic to be added to an error signal is determined based on the inverse characteristics of the respective first and second standard values, the standard values for the output signal of the amplifier 6 may be satisfied. A frequency characteristic to be added to an error signal may be determined based on a result obtained by multiplying the inverse characteristics by a predetermined number in the direction of power. Thus, the level of residual distortion in the output signal of the amplifier 6 may be further reduced and the standard values for the output signal may be more reliably satisfied.

Even in the case where at least one of the first standard value and the second standard value is locally small, the standard values for the output signal of the amplifier 6 may be satisfied by a method substantially the same as or similar to that described above. A frequency characteristic is determined and added to an error signal such that the output signal of the amplifier 6 satisfies the standard values. The frequency characteristic added to the error signal by the frequency-characteristic adding unit 13 may be sequentially updated while whether the output signal of the amplifier 6 satisfies the standard values is being monitored.

Figure 17:
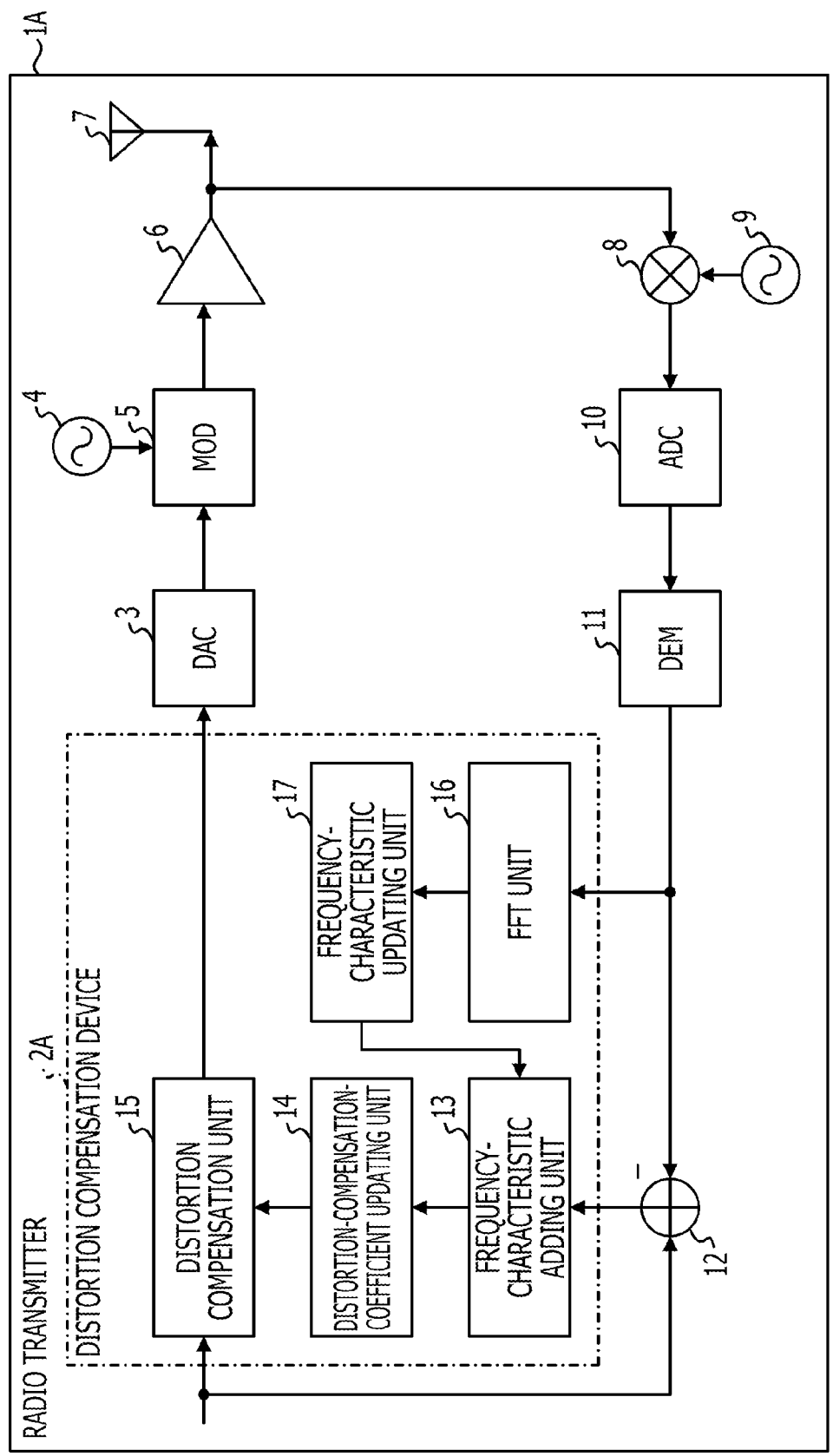
FIG. 17 illustrates an exemplary radio transmitter.

FIG. 17 illustrates an exemplary radio transmitter. A distortion compensation device 2A of a radio transmitter 1A illustrated in FIG. 17 may be realized by adding a fast Fourier transform (FFT) unit 16 and a frequency-characteristic updating unit 17 to the distortion compensation device 2 illustrated in FIG. 2. In FIG. 17, elements substantially the same as or similar to those illustrated in FIG. 2 are given the same reference numerals and their description may be omitted or reduced.

The FFT unit 16 performs an FFT on a feedback signal of the output signal of the amplifier 6 to analyze the level of residual distortion contained in the output signal, for example, in the feedback signal. Based on the analysis made by the FFT unit 16, the frequency-characteristic updating unit 17 sequentially updates a frequency characteristic added to an error signal until the first distortion level and the second distortion level in the output signal of the amplifier 6 satisfy the first standard value and the second standard value, respectively.

Figure 18:
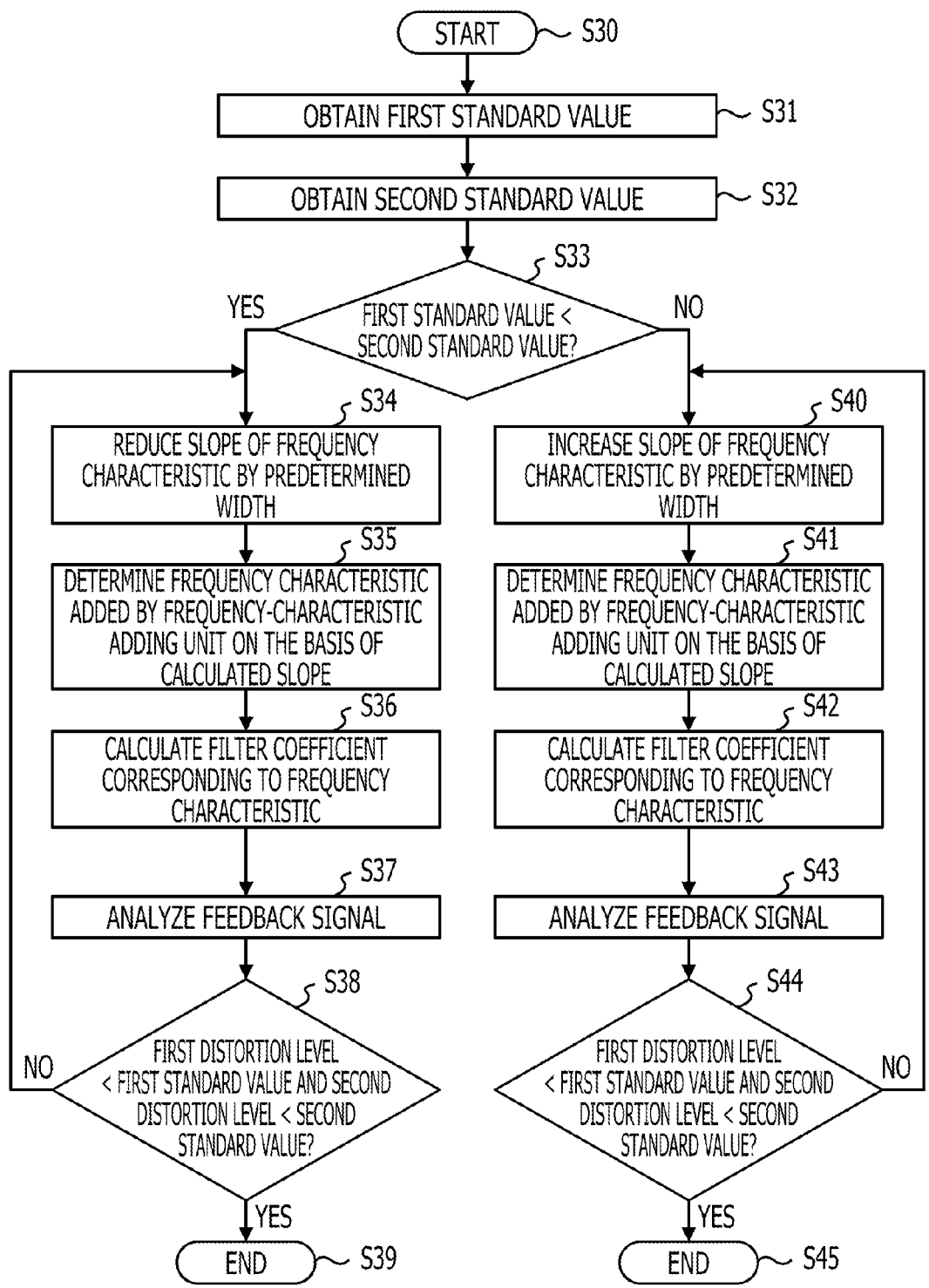
FIG. 18 illustrates an exemplary process of calculating a frequency characteristic.

At the time immediately after the operation of the distortion compensation device 2A illustrated in FIG. 17, the frequency characteristic added to the error signal is zero. Then, the frequency characteristic added to the error signal may be updated until both the standard values for the output signal of the amplifier 6 are satisfied. FIG. 18 illustrates an exemplary process of calculating a frequency characteristic. FIG. 18 may illustrate a process of calculation performed when the frequency characteristic added to the error signal is represented by a linear function.

In operation S30, a process of calculating a frequency characteristic is started, for example, in response to the start of operation of the amplifier 6. In operations S31 and S32, the frequency-characteristic updating unit 17 obtains the first standard value and the second standard value corresponding to the output signal of the amplifier 6. The standard values may be either stored by the frequency-characteristic updating unit 17 in advance or set externally by an administrator or user of the radio transmitter 1A. Based on interference waves from other systems located around the radio transmitter 1A, the frequency-characteristic updating unit 17 may calculate each standard value that does not cause interference with frequency signals used by the other systems.

In operation S33, to determine which of the first standard value and the second standard value is stricter, the frequency-characteristic updating unit 17 determines, for example, whether the first standard value is smaller than the second standard value. If the first standard value is smaller than the second standard value (YES in operation S33), the process proceeds to operation S34. In operation S34, the frequency-characteristic updating unit 17 reduces the slope of the frequency characteristic represented in the form of a linear function by a predetermined width $\Delta x$ ($\Delta x > 0$) from an initial value of 0. If the first standard value and the second standard value are equal, the calculation method illustrated in FIG. 7 and FIG. 8 may be used to calculate the slope of the frequency characteristic which is represented by a linear function and is added to the error signal, so that the frequency characteristic is determined.

In operation S35, based on the slope calculated in operation S34, the frequency-characteristic updating unit 17 determines the frequency characteristic to be added to the error signal by the frequency-characteristic adding unit 13. The frequency-characteristic updating unit 17 notifies the frequency-characteristic adding unit 13 of information about the frequency characteristic determined in operation S35. In operation S36, the frequency-characteristic adding unit 13 calculates a filter coefficient corresponding to the frequency characteristic determined in operation S35. For example, the frequency-characteristic adding unit 13 sets the calculated filter coefficient in a digital filter. Thus, the frequency characteristic determined in operation S35 is added to the error signal.

In operation S37, the FFT unit 16 analyzes a feedback signal of the output signal of the amplifier 6 to detect the first distortion level and the second distortion level in the output signal. The FFT unit 16 may notify the frequency-characteristic updating unit 17 of the result of the detection. In operation S38, based on the result of the detection received from the FFT unit 16, the frequency-characteristic updating unit 17 determines whether the first distortion level and the second distortion level in the output signal of the amplifier 6 are lower than the first standard value and the second standard value, respectively.

If the first distortion level and the second distortion level are lower than the first standard value and the second standard value, respectively (YES in operation S38), the frequency-characteristic updating unit 17 determines in operation S39 that the output signal of the amplifier 6 satisfies both the standard values. Then, the frequency-characteristic updating unit 17 stops updating the frequency characteristic added to the error signal. If the first distortion level is lower than the first standard value and the second distortion level is not lower than the second standard value (NO in operation S38), the frequency-characteristic updating unit 17 determines that the output signal of the amplifier 6 does not satisfy one of the standard values. Then, the frequency-characteristic updating unit 17 repeats operations S34 to S38 until it determines that the output signal of the amplifier 6 satisfies both the standard values. If the output signal of the amplifier 6 does not satisfy the standard values even after the elapse of a predetermined period of time, the predetermined width $\Delta x$ described above may be changed. If the predetermined width $\Delta x$ is changed significantly, the time for the output signal of the amplifier 6 to satisfy the standard values may be reduced. If the predetermined width $\Delta x$ is changed by a small amount, each distortion level in the output signal of the amplifier 6 may be more finely controlled, so that the output signal may reliably satisfy the standard values.

In operation S33, if the first standard value is not smaller than the second standard value (NO in operation S33), the process proceeds to operation S40. In operation S40, the frequency-characteristic updating unit 17 increases the slope of the frequency characteristic represented in the form of a linear function by a predetermined width $\Delta y$ ($\Delta y > 0$) from an initial value of 0. The predetermined width $\Delta y$ may be either equal to or different from the predetermined width $\Delta x$.

In operation S41, based on the slope calculated in operation S40, the frequency-characteristic updating unit 17 determines the frequency characteristic to be added to the error signal by the frequency-characteristic adding unit 13. The frequency-characteristic updating unit 17 notifies the frequency-characteristic adding unit 13 of information about the frequency characteristic determined in operation S41. In operation S42, the frequency-characteristic adding unit 13 calculates a filter coefficient corresponding to the frequency characteristic determined in operation S41. For example, the frequency-characteristic adding unit 13 sets the calculated filter coefficient in a digital filter. Thus, the frequency characteristic determined in operation S41 is added to the error signal.

In operation S43, the FFT unit 16 analyzes a feedback signal of the output signal of the amplifier 6 to detect the first distortion level and the second distortion level in the output signal, and notifies the frequency-characteristic updating unit 17 of the result of the detection. In operation S44, based on the result of the detection received from the FFT unit 16, the frequency-characteristic updating unit 17 determines whether the first distortion level and the second distortion level in the output signal of the amplifier 6 are lower than the first standard value and the second standard value, respectively.

If the first distortion level and the second distortion level are lower than the first standard value and the second standard value, respectively (YES in operation S44), the frequency-characteristic updating unit 17 determines in operation S45 that the output signal of the amplifier 6 satisfies both the standard values. Then, the frequency-characteristic updating unit 17 stops updating the frequency characteristic added to the error signal. If the first distortion level is lower than the first standard value and the second distortion level is not lower than the second standard value (NO in operation S44), the frequency-characteristic updating unit 17 determines that the output signal of the amplifier 6 does not satisfy one of the standard values. Then, the frequency-characteristic updating unit 17 repeats operations S40 to S44 until it determines that the output signal of the amplifier 6 satisfies both the standard values. If the output signal of the amplifier 6 does not satisfy the standard values even after the elapse of a predetermined period of time, the predetermined width $\Delta y$ described above may be changed. If the predetermined width $\Delta y$ is changed significantly, the time for the output signal of the amplifier 6 to satisfy the standard values may be reduced. If the predetermined width $\Delta y$ is changed by a small amount, each distortion level in the output signal of the amplifier 6 may be more finely controlled, so that the output signal may reliably satisfy the standard values.

In a direct leaning configuration where a distortion compensation coefficient is updated based on an error signal between a transmission signal before being distortion-compensated by the distortion compensation unit 15 and an output signal output from the amplifier 6, a predetermined frequency characteristic is added to the error signal. This may reduce the size of a distortion compensation circuit.

In the direct leaning configuration, a signal-in-training may appear in the output signal of the amplifier 6. By adding a predetermined frequency characteristic to an error signal in an indirect leaning configuration, the appearance of a signal-in-training in the output signal of the amplifier 6 may be reduced.

Figure 19:
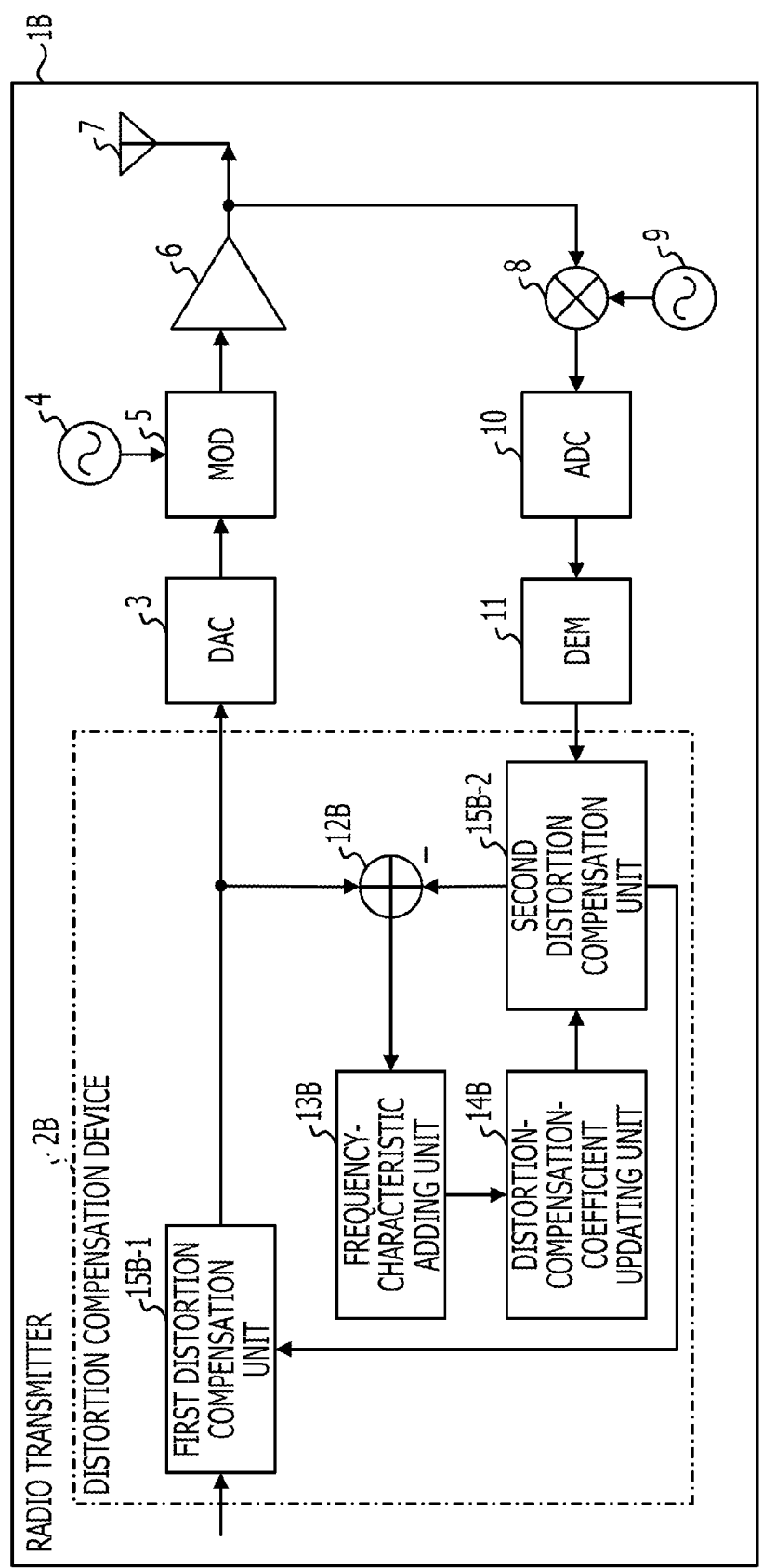
FIG. 19 illustrates an exemplary radio transmitter.

FIG. 19 illustrates an exemplary radio transmitter. In FIG. 19, elements substantially the same as or similar to those illustrated in FIG. 2 or FIG. 17 are given the same reference numerals and their description may be omitted or reduced. A distortion compensation device 2B of a radio transmitter 1B illustrated in FIG. 19 includes an adder 12B, a frequency-characteristic adding unit 13B, a distortion-compensation-coefficient updating unit 14B, a first distortion compensation unit 15B-1, and a second distortion compensation unit 15B-2.

The first distortion compensation unit 15B-1 is used to perform distortion compensation on an input signal input to the amplifier 6. The second distortion compensation unit 15B-2 is used for learning a distortion compensation coefficient. By copying a distortion compensation coefficient sufficiently learned by the second distortion compensation unit 15B-2 to the first distortion compensation unit 15B-1, the appearance of a signal-in-training in the output signal of the amplifier 6 may be reduced. The first distortion compensation unit 15B-1 may not perform distortion compensation until the distortion compensation coefficient sufficiently learned by the second distortion compensation unit 15B-2 is copied to the first distortion compensation unit 15B-1. Thus, the appearance of a signal-in-training in the output signal of the amplifier 6 may be reduced.

The second distortion compensation unit 15B-2 uses a distortion compensation coefficient updated by the distortion-compensation-coefficient updating unit 14B to perform distortion compensation on a feedback signal. For example, the second distortion compensation unit 15B-2 controls the amplitude or phase of the input signal such that distortion components contained in an error signal to which a predetermined frequency characteristic has been added by the frequency-characteristic adding unit 13B are uniformly distributed on the frequency axis. The functions of the distortion-compensation-coefficient updating unit 14B, the first distortion compensation unit 15B-1, and the second distortion compensation unit 15B-2 may be executed by a processor, such as a CPU or DSP.

The adder 12B adds an output signal of the first distortion compensation unit 15B-1 to an inverted output signal of the second distortion compensation unit 15B-2 to generate an error signal, and supplies the error signal to the frequency-characteristic adding unit 13B. The frequency-characteristic adding unit 13B adds a predetermined frequency characteristic to the error signal supplied from the adder 12B. The frequency characteristic to be added to the error signal may be determined by a method substantially the same as or similar to that described above. For example, the frequency-characteristic adding unit 13B may calculate the frequency characteristic to be added to the error signal as a linear function having a slope determined based on a difference between the first standard value and the second standard value set for the first frequency band and the second frequency band, respectively. The frequency-characteristic adding unit 13B may use the method illustrated in FIG. 12 to FIG. 16 to calculate the frequency characteristic added to the error signal. The FFT unit 16 and the frequency-characteristic updating unit 17 may be added to the configuration illustrated in FIG. 19. In that case, the FFT unit 16 analyzes the output of the second distortion compensation unit 15B-2 and, based on the analysis made by the FFT unit 16, the frequency-characteristic updating unit 17 updates the frequency characteristic to be added by the frequency-characteristic adding unit 13B. The frequency characteristic to be added to the error signal by the frequency-characteristic adding unit 13B may be sequentially updated while whether the output signal of the amplifier 6 satisfies the standard values is being monitored.

The function of the frequency-characteristic adding unit 13B may be realized, for example, by an analog or digital filter. The function of the frequency-characteristic adding unit 13B may be realized, for example, by a processor, such as a CPU or DSP. For example, the frequency-characteristic adding unit 13B may include an equalizer, such as an FIR or IIR filter. If the input signal is a complex signal, the frequency-characteristic adding unit 13B may include a complex coefficient FIR filter or a complex coefficient IIR filter.

Based on the error signal to which the predetermined frequency characteristic has been added by the frequency-characteristic adding unit 13B, the distortion-compensation-coefficient updating unit 14B updates a distortion compensation coefficient to be supplied to the second distortion compensation unit 15B-2. For example, based on the error signal to which the predetermined frequency characteristic has been added by the frequency-characteristic adding unit 13B, the distortion-compensation-coefficient updating unit 14B calculates an update for the distortion compensation coefficient. As a new distortion compensation coefficient, a value obtained by adding the update to the current distortion compensation coefficient is supplied from the distortion-compensation-coefficient updating unit 14B to the second distortion compensation unit 15B-2. Thus, the distortion compensation coefficient is updated. The distortion-compensation-coefficient updating unit 14B may include a distortion compensation table that stores distortion compensation coefficients for compensating for a distortion characteristic of the amplifier 6. The distortion compensation table may store, for example, amplitude/phase compensation data (distortion compensation coefficient) corresponding to power of the input signal in associated with the amplitude of the input signal. For example, the distortion compensation table may be either internal or external to the distortion compensation device 2B. The distortion compensation table may be a memory, such as a ROM or RAM. The distortion-compensation-coefficient updating unit 14B may generate a predistortion signal using a Volterra series or a memory polynomial expansion.

After the distortion compensation coefficient is sufficiently learned, the second distortion compensation unit 15B-2 copies the predistortion signal in the second distortion compensation unit 15B-2 to the first distortion compensation unit 15B-1 to reflect it. A determination as to whether the distortion compensation coefficient has been sufficiently learned may be made, for example, based on whether the update calculated by the distortion-compensation-coefficient updating unit 14B has fallen below a predetermined threshold. The appearance of a signal-in-training in the output signal of the amplifier 6 may be reduced.

The configurations and functions of the distortion compensation devices 2, 2A, and 2B and the radio transmitters 1, 1A, and 1B may be used either selectively or in combination.

For example, the radio transmitters 1, 1A, and 1B may be used as radio transmission modules in radio base stations and radio terminals. The distortion compensation devices 2, 2A, and 2B may be used in other equipment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device comprising:
a frequency-characteristic adding unit configured to add a frequency characteristic to an error signal to generate an added error signal, the error signal being a difference between an input signal input to an amplifier and an output signal output from the amplifier;
a distortion-compensation-coefficient updating unit configured to update a distortion compensation coefficient for compensating for a distortion characteristic of the amplifier based on the added error signal; and
a distortion compensation unit configured to perform distortion compensation on the input signal using the updated distortion compensation coefficient, wherein the frequency characteristic is set such that a first distortion level of the output signal satisfies a first standard value and a second distortion level of the output signal satisfies a second standard value, the first distortion level having a first frequency band lower than a frequency band of the input signal, the second distortion level having a second frequency band higher than the frequency band of the input signal.

2. The distortion compensation device according to claim 1, wherein the frequency characteristic is set such that the first distortion level is different from the second distortion level.

3. The distortion compensation device according to claim 1, wherein the frequency characteristic is represented by a linear function having a slope based on a difference or ratio between the first standard value and the second standard value.

4. The distortion compensation device according to claim 1, wherein the frequency characteristic is set based on inverse characteristics of the respective first and second standard values.

5. The distortion compensation device according to claim 1, further comprising a frequency-characteristic updating unit configured to update the frequency characteristic until the first distortion level and the second distortion level satisfy the first standard value and the second standard value, respectively.

6. A distortion compensation method comprising:
adding a frequency characteristic to an error signal to generate an added error signal, the error signal being a difference between an input signal input to an amplifier and an output signal output from the amplifier;
computing a distortion compensation coefficient for compensating for a distortion characteristic of the amplifier based on the added error signal; and
performing distortion compensation on the input signal based on the computed distortion compensation coefficient, wherein the frequency characteristic is set such that a first distortion level of the output signal satisfies a first standard value and a second distortion level of the output signal satisfies a second standard value, the first distortion level having a first frequency band lower than a frequency band of the input signal, the second distortion level having a second frequency band higher than the frequency band of the input signal.

7. The distortion compensation method according to claim 6, wherein the frequency characteristic is set such that the first distortion level is different from the second distortion level.

8. The distortion compensation method according to claim 6, wherein the frequency characteristic is represented by a linear function having a slope based on a difference or ratio between the first standard value and the second standard value.

9. The distortion compensation method according to claim 6, wherein the frequency characteristic is set based on inverse characteristics of the respective first and second standard values.

10. The distortion compensation method according to claim 6, further comprising updating the frequency characteristic until the first distortion level and the second distortion level satisfy the first standard value and the second standard value, respectively.

11. A radio transmitter comprising:
a distortion compensation device;
a digital-to-analog converter configured to perform digital-to-analog conversion on an output signal of the distortion compensation device;
a quadrature modulator configured to quadrature-modulate an output of the digital-to-analog converter;
an amplifier configured to amplify an output of the quadrature modulator; and
an antenna configured to output an output of the amplifier to the outside,
wherein the distortion compensation device includes:
a frequency-characteristic adding unit configured to add a frequency characteristic to an error signal to generate an added error signal, the error signal being a difference between an input signal input to the amplifier and an output signal output from the amplifier;
a distortion-compensation-coefficient updating unit configured to update a distortion compensation coefficient for compensating for a distortion characteristic of the amplifier based on the added error signal; and
a distortion compensation unit configured to perform distortion compensation on the input signal using the updated distortion compensation coefficient,
wherein the frequency characteristic is set such that a first distortion level of the output signal satisfies a first standard value and a second distortion level of the output signal satisfies a second standard value, the first distortion level having a first frequency band lower than a frequency band of the input signal, the second distortion level having a second frequency band higher than the frequency band of the input signal.

12. The radio transmitter according to claim 11, further comprising:
- an analog-to-digital converter configured to perform analog-to-digital conversion on the output signal of the amplifier; and
- a quadrature demodulator configured to quadrature-demodulate an output of the analog-to-digital converter and output the quadrature-demodulated signal to the distortion compensation device.

* * * * *